United States Patent
Misra et al.

(10) Patent No.: US 9,929,306 B2
(45) Date of Patent: Mar. 27, 2018

(54) ARRAY OF MONOLITHICALLY INTEGRATED THIN FILM PHOTOVOLTAIC CELLS AND ASSOCIATED METHODS

(71) Applicant: Ascent Solar Technologies, Inc., Thornton, CO (US)

(72) Inventors: Mohan S. Misra, Golden, CO (US); Prem Nath, Fort Lauderdale, FL (US); Venugopala R. Basava, Highlands Ranch, CO (US)

(73) Assignee: Ascent Solar Technologies, Inc., Thornton, CO (US)

( * ) Notice: Subject to any disclaimer, the term of this patent is extended or adjusted under 35 U.S.C. 154(b) by 656 days.

(21) Appl. No.: 14/252,485

(22) Filed: Apr. 14, 2014

(65) Prior Publication Data

US 2014/0227823 A1    Aug. 14, 2014

Related U.S. Application Data

(62) Division of application No. 12/143,713, filed on Jun. 20, 2008, now Pat. No. 8,716,591.

(60) Provisional application No. 60/945,314, filed on Jun. 20, 2007.

(51) Int. Cl.
*H01L 31/042* (2014.01)
*H01L 31/18* (2006.01)
*H01L 31/05* (2014.01)
*H01L 31/0465* (2014.01)

(52) U.S. Cl.
CPC ...... *H01L 31/1876* (2013.01); *H01L 31/0465* (2014.12); *H01L 31/05* (2013.01); *Y02E 10/50* (2013.01)

(58) Field of Classification Search
CPC .................................................. H01L 31/1876
See application file for complete search history.

(56) References Cited

U.S. PATENT DOCUMENTS

| | | | |
|---|---|---|---|
| 4,532,371 A | 7/1985 | Hanak et al. | |
| 5,131,954 A | 7/1992 | Vogeli et al. | |
| 5,593,901 A | 1/1997 | Oswald et al. | |

(Continued)

FOREIGN PATENT DOCUMENTS

| | | |
|---|---|---|
| EP | 0320089 | 6/1989 |
| JP | 62084569 | 4/1987 |

OTHER PUBLICATIONS

PCT/US2008/067772 Response to Written Opinion filed May 1, 2009, 21 pages.

(Continued)

*Primary Examiner* — Shannon Gardner
(74) *Attorney, Agent, or Firm* — Lathrop Gage LLP

(57) ABSTRACT

A process of forming an array of monolithic ally integrated thin film photo voltaic cells from a stack of thin film layers formed on an insulating substrate includes forming at least one cell isolation scribe in the stack of thin film layers. A second electrical contact layer isolation scribe is formed for each cell isolation scribe adjacent to a respective cell isolation scribe. A via scribe is formed in the stack of thin film layers between each cell isolation scribe and its respective second electrical contact layer isolation scribe. Insulating ink is disposed in each cell isolation scribe, and conductive ink is disposed in each via scribe to form a via. Conductive ink is also disposed along the top surface of the stack of thin film layers to form at least one conductive grid.

11 Claims, 14 Drawing Sheets

(56) References Cited

U.S. PATENT DOCUMENTS

| | | | |
|---|---|---|---|
| 5,716,459 | A | 2/1998 | Chang et al. |
| 6,300,158 | B1 | 10/2001 | Simburger et al. |
| 6,310,281 | B1 | 10/2001 | Wendt et al. |
| 6,372,538 | B1 | 4/2002 | Wendt et al. |
| 6,410,362 | B1 | 6/2002 | Simburger et al. |
| 6,653,550 | B2 | 11/2003 | Hayashi et al. |
| 7,194,197 | B1 | 3/2007 | Wendt et al. |
| 7,235,736 | B1 | 6/2007 | Buller et al. |
| 2001/0037823 | A1 | 11/2001 | Middelman et al. |
| 2005/0145274 | A1 | 7/2005 | Polce et al. |
| 2005/0183767 | A1 | 8/2005 | Yu et al. |
| 2006/0157105 | A1 | 7/2006 | Nishi et al. |
| 2007/0012353 | A1 | 1/2007 | Fischer et al. |
| 2007/0079866 | A1 | 11/2007 | Wendt et al. |
| 2008/0029154 | A1 | 2/2008 | Milshtein et al. |
| 2008/0115827 | A1 | 5/2008 | Woods |

OTHER PUBLICATIONS

PCT/US2008/067772 International Preliminary Report on Patentability dated Sep. 22, 2009, 16 pages.

PCT/US2008/067772 International Search Report and Written Opinion dated Feb. 2, 2009, 14 pages.

U.S. Appl. No. 12/143,713 select file history dated May 28, 2010 through Dec. 20, 2013, 125 pages.

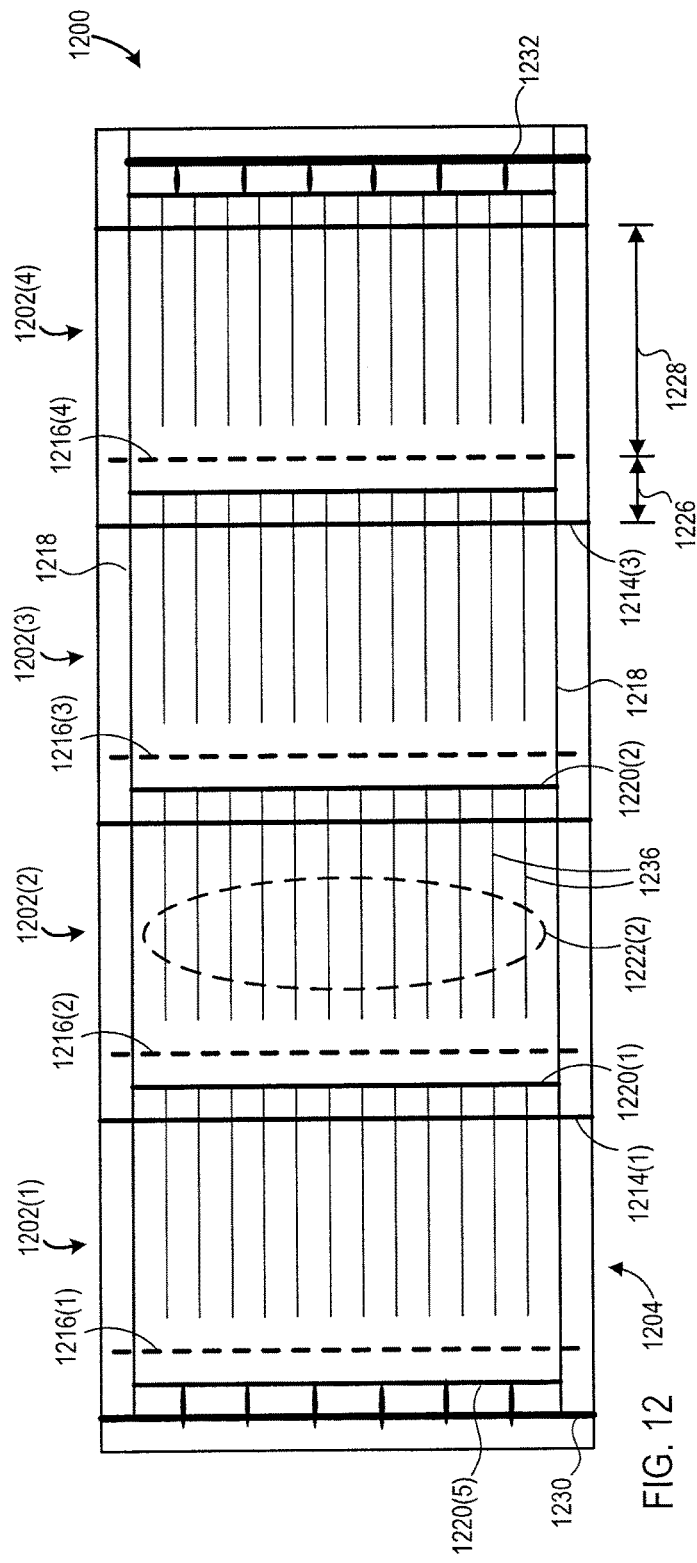
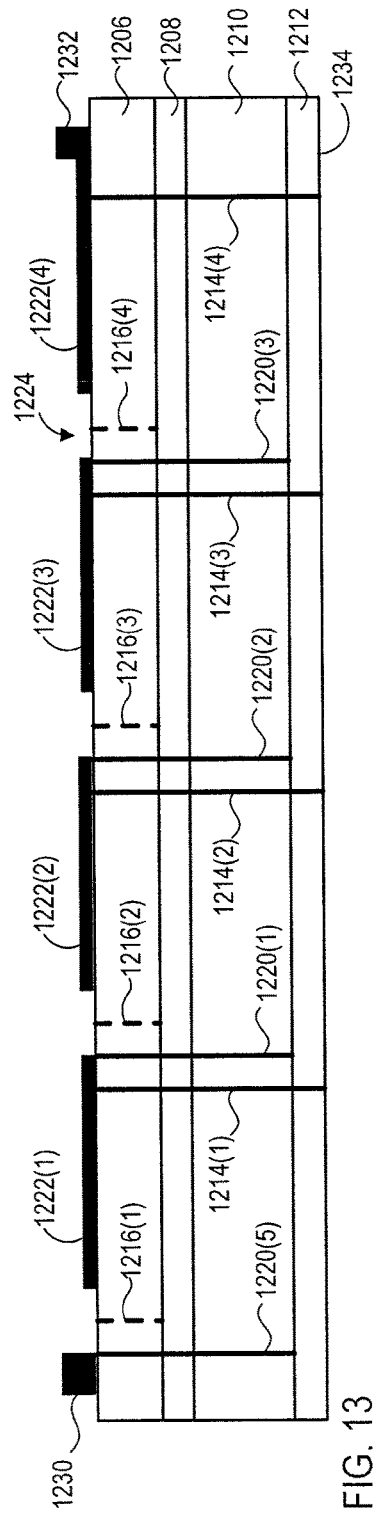
FIG. 12
FIG. 13

ARRAY OF MONOLITHICALLY INTEGRATED THIN FILM PHOTOVOLTAIC CELLS AND ASSOCIATED METHODS

CROSS REFERENCE TO RELATED APPLICATIONS

This application is a divisional of U.S. patent application Ser. No. 12/143,713 filed 20 Jun. 2008, which claims benefit of priority to U.S. Provisional Application Ser. No. 60/945,314 filed 20 Jun. 2007. Each of the above-mentioned applications is incorporated herein by reference.

BACKGROUND

A photovoltaic cell generates electric power from electromagnetic energy (e.g., sunlight) incident thereon. Thin film photovoltaic cells are a class of photovoltaic cells formed by depositing a plurality of thin films onto a substrate, each of which serves one or more specific functions. Thin film photovoltaic cells generally include a first electrical contact layer, one or more films that comprise the active photovoltaic device, and a second electrical contact layer. Depending upon the orientation of the photovoltaic cell, at least one of the first and second electrical contact layers is transparent to allow electromagnetic energy to reach the active device films. If the substrate is an insulating substrate (that is, the substrate has a high electrical resistivity interface for forming one of the first or second electrical contacts thereon), a plurality of thin film photovoltaic cells can be monolithically integrated onto the insulating substrate.

The magnitude of an electric current generated by a thin film photovoltaic cell is proportional the area of the photovoltaic cell. However, the magnitude of a voltage generated by the thin film photovoltaic cell is largely a function of the materials used to form the thin film layers. Accordingly, in order to increase an output voltage magnitude of an array of thin film photovoltaic cells, a plurality of cells may be electrically connected in series.

SUMMARY

A process of forming an array of monolithically integrated thin film photovoltaic cells from a stack of thin film layers formed on an insulating substrate includes the following steps. At least one cell isolation scribe is formed in the stack of thin film layers. Each instance of the at least one cell isolation scribe delineates the stack of thin film layers into a plurality of photovoltaic cells, and each instance of the at least one cell isolation scribe extends from a top surface of the stack of thin film layers to the substrate. A second electrical contact layer isolation scribe is formed for each instance of the at least one cell isolation scribe. The second electrical contact layer isolation scribe is formed in the stack of thin film layers adjacent to a respective cell isolation scribe and extends at least through a second electrical contact layer of the stack of thin film layers. A via scribe is formed in the stack of thin film layers between each cell isolation scribe and its respective second electrical contact layer isolation scribe. Each via scribe extends at least from the top surface of the stack of thin film layers to a first electrical contact layer of the stack of thin film layers. Insulating ink is disposed in each cell isolation scribe, and conductive ink is disposed in each via scribe to form a via. Conductive ink is also disposed along the top surface of the stack of thin film layers to form at least one conductive grid, where each instance of the at least one conductive grid connects a respective via to the second electrical contact layer of an adjacent photovoltaic cell.

A process of forming an array of monolithically integrated thin film photovoltaic cells includes the following steps. A stack of thin film layers is formed on an insulating substrate. The stack of thin film layers includes a first electrical contact layer formed on the substrate, a photovoltaic stack formed on the first electrical contact layer, and a second electrical contact layer formed on the photovoltaic stack. At least one cell isolation scribe is formed in the stack of thin film layers to delineate the stack into a plurality of photovoltaic cells. Each instance of the at least one cell isolation scribe extends from a top surface of the stack of thin film layers to the substrate. A second electrical contact layer isolation scribe is formed for each instance of the at least one cell isolation scribe. Each second electrical contact layer isolation scribe is formed in the stack of thin film layers adjacent to a respective cell isolation scribe, and each second electrical contact layer isolation scribe extends at least through the second electrical contact layer of the stack of thin film layers. A via scribe is formed in the stack of thin film layers between each cell isolation scribe and its respective second electrical contact layer isolation scribe. Each via scribe extends at least from the top surface of the stack of thin film layers to the first electrical contact layer. Insulating ink is disposed in each cell isolation scribe, and conductive ink is disposed in each via scribe to form a via. Conductive ink is further disposed along the top surface of the stack of thin film layers to form at least one conductive grid. Each instance of the at least one conductive grid connects a via to the second electrical contact layer of a respective adjacent photovoltaic cell.

An array of monolithically integrated thin film photovoltaic cells includes an insulating substrate and a plurality of photovoltaic cells formed on the insulating substrate. Each photovoltaic cell is separated from at least one other photovoltaic cell by one or more cell isolation scribes filled with insulating ink. Each photovoltaic cell includes the following: (1) a first electrical contact layer formed on the insulating substrate; (2) a photovoltaic stack formed on the first electrical contact layer; (3) a second electrical contact layer formed on the photovoltaic stack; (4) a second electrical contact layer isolation scribe filled with insulating ink formed adjacent to a cell isolation scribe at least partially delineating the photovoltaic cell; (5) a via filled with conductive ink extending from the first electrical contact layer to a top surface of the array; and (6) at least one conductive grid disposed on the top surface of the array for connecting two adjacent photovoltaic cells.

A process of forming an array of monolithically integrated thin film photovoltaic cells from a stack of thin film layers formed on an insulating substrate includes the following steps. At least one cell isolation scribe is formed in the stack of thin film layers to delineate the stack of thin film layers into a plurality of photovoltaic cells. Each instance of the at least one cell isolation scribe extends from a top surface of the stack of thin film layers to a substrate of the stack of thin film layers. A second electrical contact layer isolation scribe is formed for each instance of the at least one cell isolation scribe, and each second electrical contact layer isolation scribe is formed in the stack of thin film layers adjacent to its respective cell isolation scribe. Each second electrical contact layer isolation scribe extends at least through a top contact layer of the stack of thin film layers. A via scribe is formed in the stack of thin film layers between each cell isolation scribe and its respective second electrical contact layer isolation scribe. Each via scribe extends at least from the top surface of the stack of thin film layers to a back contact layer of the stack of thin film layers. Insulating ink is disposed in each cell isolation scribe, and conductive ink is disposed in each via scribe to form a via. Conductive ink is further disposed along the top surface of the stack of thin film layers to form at least one conductive grid, where each instance of the at least one conductive grid connects a respective via to the top contact layer of an adjacent photovoltaic cell.

A process of forming an array of monolithically integrated thin film photovoltaic cells from a stack of thin film layers formed on an insulating substrate includes the following steps. At least one second electrical contact layer isolation scribe is formed in a second electrical contact layer of the stack of thin film layers. A first portion of each instance of the at least one second electrical contact layer isolation scribe is extended to a substrate to form a cell isolation scribe for each instance of the at least one second electrical contact layer isolation scribe. Insulating ink is disposed in each cell isolation scribe and in each instance of the at least one second electrical contact layer isolation scribe. A via scribe is formed for each instance of the at least one second electrical contact layer isolation scribe. Each via scribe extends at least through the insulating ink of a second portion of a respective second electrical contact layer isolation scribe to a first electrical contact layer. The second portion does not overlap the first portion of each instance of the at least one second electrical contact layer isolation scribe. Conductive ink is disposed in each via scribe to form a via. Conductive ink is disposed along a top surface of the stack of thin film layers to form at least one conductive grid. Each instance of the at least one conductive grid connects a respective via to the second electrical contact layer of an adjacent photovoltaic cell.

A process of forming an array of monolithically integrated thin film photovoltaic cells from a stack of thin film layers formed on an insulating substrate includes the following steps. At least one second electrical contact layer isolation scribe is formed in the stack of thin film layers. Each instance of the at least one second electrical contact layer isolation scribe extends at least through the second electrical contact layer of the stack of thin film layers. A first portion of each instance of the at least one second electrical contact layer isolation scribe is extended to a substrate to form a cell isolation scribe for each instance of the at least one second electrical contact layer isolation scribe. A second portion of each instance of the at least one second electrical contact layer isolation scribe is extended to a first electrical contact layer to form a via scribe. The second portion does not overlap the first portion of each instance of the at least one second electrical contact layer isolation scribe. Insulating ink is disposed in each cell isolation scribe and in each instance of the at least one second electrical contact layer isolation scribe such that insulating ink does not fill the via scribe. Conductive ink is disposed in each via scribe to form a via. Conductive ink is disposed along a top surface of the stack of thin film layers to form at least one conductive grid. Each instance of the at least one conductive grid connects a respective via to the second electrical contact layer of an adjacent photovoltaic cell.

BRIEF DESCRIPTION OF DRAWINGS

FIG. 12 is a top plan view of one array of monolithically integrated photovoltaic cell formed according to the processes of FIG. 3 or 4.

FIG. 13 is a cross-sectional view of the array of monolithically integrated photovoltaic cells of FIG. 12.

DETAILED DESCRIPTION OF DRAWINGS

Figure 1:
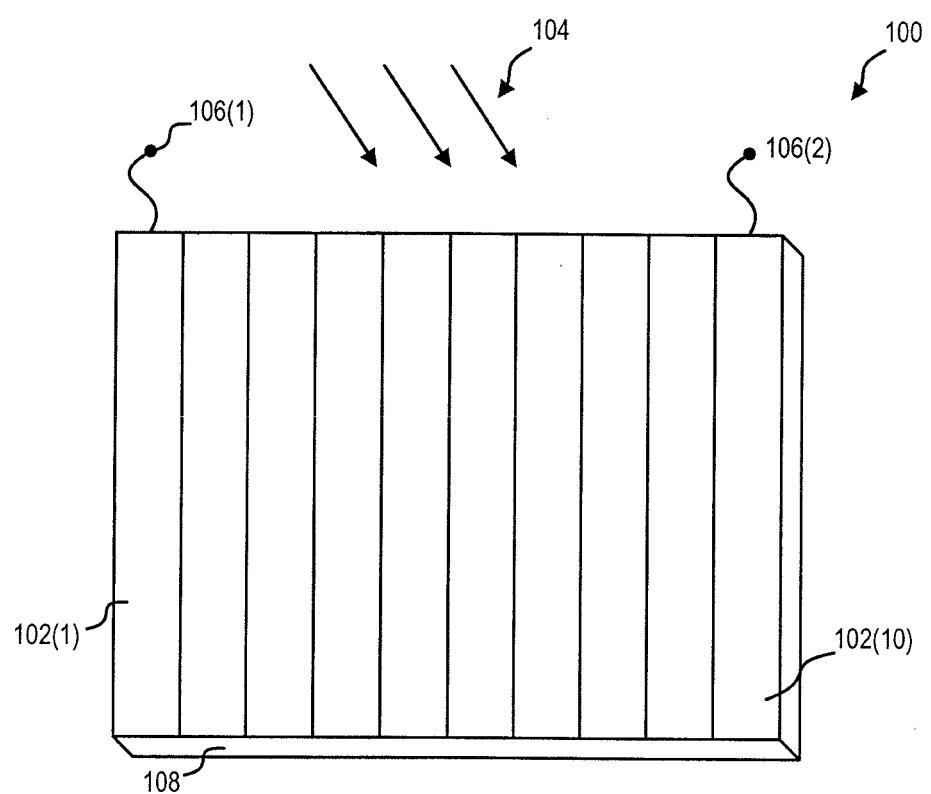
FIG. 1 is a top perspective view of one array of monolithically integrated photovoltaic cells, in accord with an embodiment.

It is noted that, for purposes of illustrative clarity, certain elements in the drawings may not be drawn to scale. Specific instances of an element may be referred to by use of a numeral in parentheses (e.g., photovoltaic cell 102(1)) while numerals without parentheses refer to any such item (e.g., photovoltaic cells 102).

FIG. 1 is a top perspective view of one array 100 of monolithically integrated photovoltaic cells 102, which generate electric power from electromagnetic radiation 104 (e.g., sunlight), either incident on the photovoltaic cells, or transmitted to the photovoltaic cells through a transparent substrate. The electric power is accessible via electrical terminals 106(1) and 106(2). Array 100 includes a plurality of photovoltaic cells 102 monolithically integrated onto an insulating substrate 108. Substrate 108 may be, but need not be, at least partially transparent. Although array 100 is illustrated as including ten photovoltaic cells 102 (only photovoltaic cells 102(1) and 102(10) are labeled for illustrative clarity), array 100 may include any quantity of photovoltaic cells 102.

Photovoltaic cells 102 are, for example, electrically connected in series. In such a case, a voltage magnitude measured between electrical terminals 106(1) and 106(2) is approximately the sum of the voltages generated by each photovoltaic cell 102, neglecting losses due to impedance of interconnections between photovoltaic cells 102.

Figure 2:
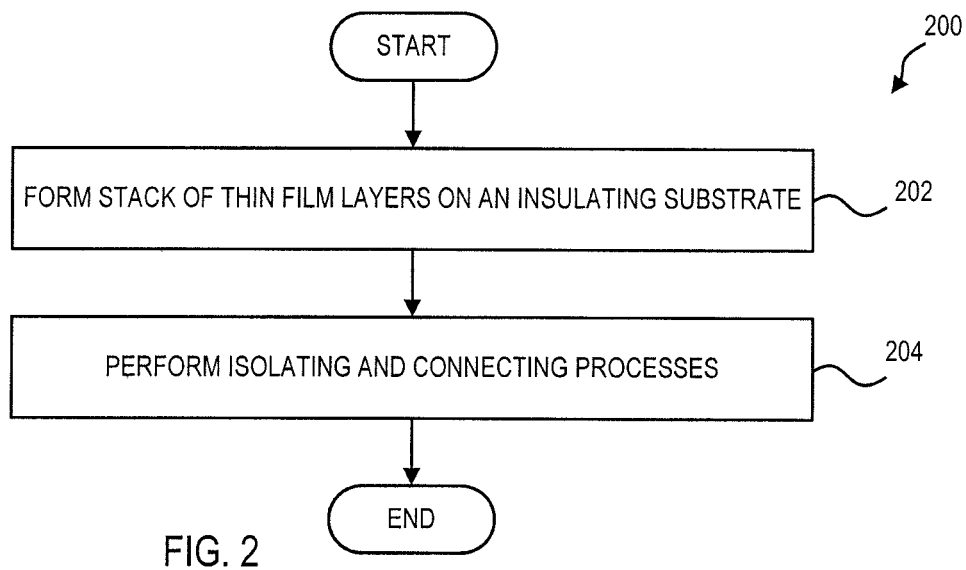
FIG. 2 shows one process of forming an array of monolithically integrated photovoltaic cells, in accord with an embodiment.

FIG. 2 shows a process 200 of forming an array of monolithically integrated photovoltaic cells. Process 200 may be used, for example, to form array 100 of FIG. 1. Process 200 begins with step 202 of forming a stack of thin film layers on an insulating substrate. Process 200 proceeds to step 204 where isolating and connecting processes are performed on the stack of thin film layers formed in step 202. The isolating and connecting processes form the plurality of monolithically integrated photovoltaic cells from the stack of thin film layers. In an embodiment of process 200, the isolating and connecting processes of step 204 include scribing and printing processes, as discussed below with respect to FIGS. 3 and 6A-6E, FIGS. 4 and 7A-7F, FIGS. 8 and 10A-10E, and FIGS. 9 and 11A-11F. It should be appreciated that in process 200, the step of forming the stack of thin film layers may be different from the step performing the isolating and connecting processes. This division of steps may provide one or more benefits, as discussed below.

Step 202 is executed using processes acceptable for forming a stack of thin film layers on an insulating substrate. In an embodiment of process 200, step 202 is executed using a roll-to-roll deposition process and/or using a single deposition line. Furthermore, in step 202, a bulk sheet of thin film layers may be formed on an insulating substrate and subsequently cut into two or more sections; one of these sections may then be used in step 204. Such cutting may be performed using a production apparatus (e.g., laser system) with means for translating a laser beam and/or the substrate to facilitate the patterning.

Figure 5:
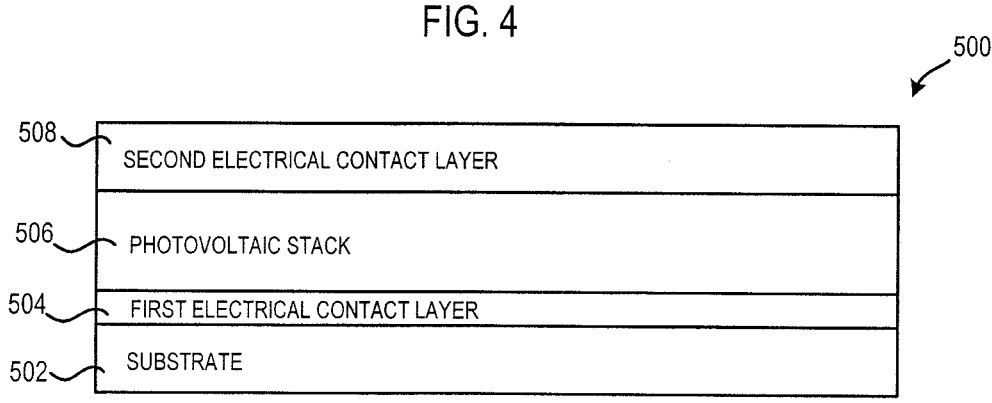
FIG. 5 is a cross-sectional view of one stack of thin-film layers formed on an insulating substrate, in accord with an embodiment.

FIG. 5 is a cross-sectional view of one stack 500 of thin film layers formed on an insulating substrate. Stack 500 is an example of a stack that may be formed in step 202 of process 200. Stack 500 includes an insulating substrate 502, a first electrical contact layer 504 formed on substrate 502, a photovoltaic stack 506 formed on first electrical contact layer 504, and a second electrical contact layer 508 formed on photovoltaic stack 506. The term "insulating substrate," in the context of stack 500, means that substrate 502 has an interface with a high electrical resistivity for forming a first electrical contact layer (e.g., layer 504) thereon.

Substrate 502 is, for example, an insulated metal substrate, a glass substrate, or a polymeric material substrate. Photovoltaic stack 506 includes of one or more thin film layers for converting electromagnetic energy (e.g., sunlight) into electrical power. For example, photovoltaic stack 506 may include thin film semiconductor and oxide layers forming at least one junction having one of a p-n, n-p, p-i-n, and n-i-p configuration with respect to first electrical contact layer 504. Photovoltaic stack 506 may include one or more sequences of the semiconductor layers. Such sequences include, for example, a solar absorber layer and/or a window layer.

The solar absorber layer includes, for example, a copper group I-III-VI material or a silver based group I-III-VI material. In each of these two cases, the solar absorber layer may further include at least one alloy, where the alloy includes gallium, aluminum, boron, sulfur, and/or tellurium. The solar absorber layer may further include of a plurality of sublayers, where at least one of the sublayers is formed of an amorphous-silicon based material or a micro-silicon based material.

The window layer may include cadmium sulfide, zinc sulfide, alloys of cadmium-zinc sulfide, zinc oxide, zinc hydroxide, zinc-magnesium oxide, magnesium hydroxide, and/or indium selenide.

Photovoltaic stack 506 may also include a buffer layer adjacent to at least one of first electrical contact layer 504 and second electrical contact layer 508. Examples of materials that may be used to form the buffer layer include undoped tin oxide or undoped zinc oxide.

First electrical contact layer 504 and second electrical contact layer 508 are each formed of an electrically conductive material. Electromagnetic energy must be able to at least partially penetrate at least one of the first or second electrical contact layers in order to reach photovoltaic stack 506. Accordingly, at least one of first electrical contact layer 504 and second electrical contact layer 508 must be at least partially transparent to electromagnetic energy having a range of wavelengths that photovoltaic stack 506 is operable to convert into electric power. Examples of materials that may be used to form transparent electrical contact layers include one or more of the following: doped tin oxide, undoped tin oxide, indium-tin oxide alloys, doped zinc oxide, and undoped zinc oxide. The following are examples of materials that may be used to form opaque electrical contact layers: molybdenum, alloys of molybdenum, aluminum, alloys of aluminum, copper, and alloys of copper. The materials used to form first electrical contact layer 504 and second electrical contact layer 508 may be selected for compatibility with the materials forming photovoltaic stack 506.

Figure 3:
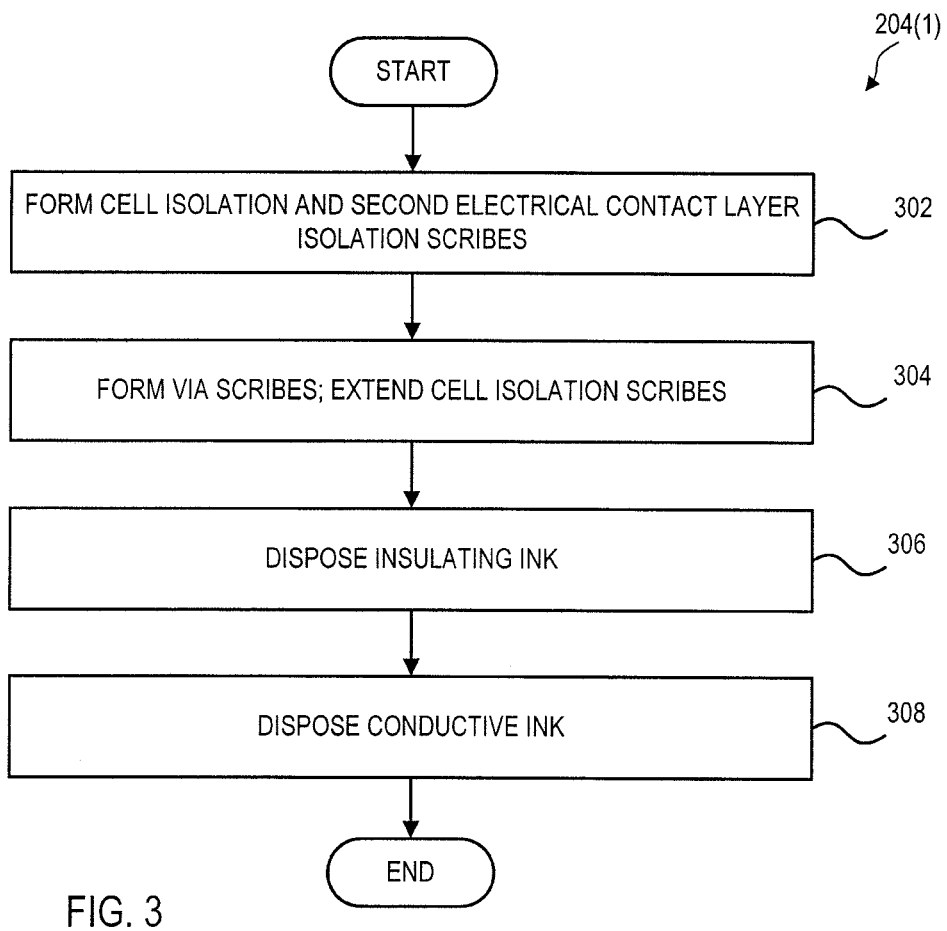
FIG. 3 shows one process of performing scribing and printing processes, in accord with an embodiment.

FIG. 3 shows one process 204(1) of performing scribing and printing processes to form an array of monolithically integrated thin film photovoltaic cells from a stack of thin film layers formed on an insulating substrate. Process 204(1) is an embodiment of step 204, and shows substeps of performing isolating and connecting processes. FIGS. 6A-6E are cross-sectional views of an array of monolithically integrated photovoltaic cells being formed according to process 204(1); FIGS. 6A-6E should be referred to in conjunction with FIG. 3.

Process 204(1) may be executed on a stack of thin film layers formed on an insulating substrate. For example, process 204(1) may be executed on stack 600 of FIG. 6A. Stack 600, which is an embodiment of stack 500 (see, FIG. 5), is illustrated as having a first electrical contact layer 604 formed on an insulating substrate 602. First electrical contact layer 604 is, for example, a back contact layer. As another example, first electrical contact layer 604 may be formed of a transparent conductive material if process 204(1) is used to form an array of photovoltaic cells having a superstrate configuration.

A photovoltaic stack 606 is formed on first electrical contact layer 604. Photovoltaic stack 606 includes, for example, a solar absorber layer formed on first electrical contact layer 604, a window layer formed on the solar absorber layer, and a buffer layer optionally formed on the window layer. As another example, photovoltaic stack 606 may include a window layer formed on first electrical contact layer 606 and a solar absorber layer formed on the window layer.

A second electrical contact layer 608 is formed on photovoltaic stack 606. Second electrical contact layer 608 is, for example, a top contact layer or a back contact layer. Stack 600 may have layers in addition to those illustrated in FIGS. 6A-6E.

Figure 6A:
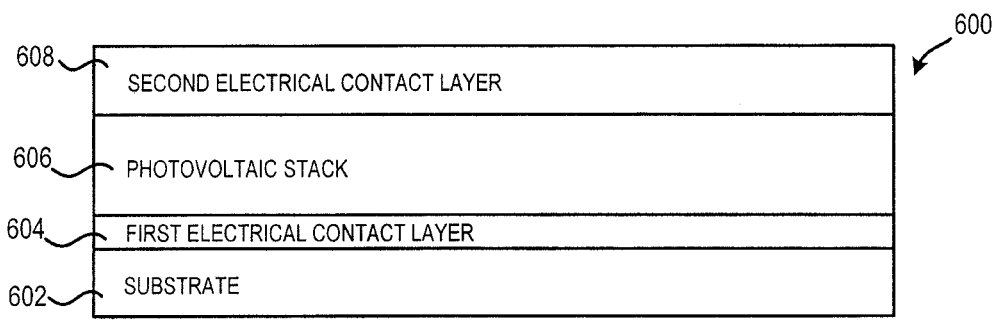
FIGS. 6A-6E are cross-sectional views of an array of monolithically integrated photovoltaic cells formed according to an embodiment of the process of FIG. 3.
Figure 6B:
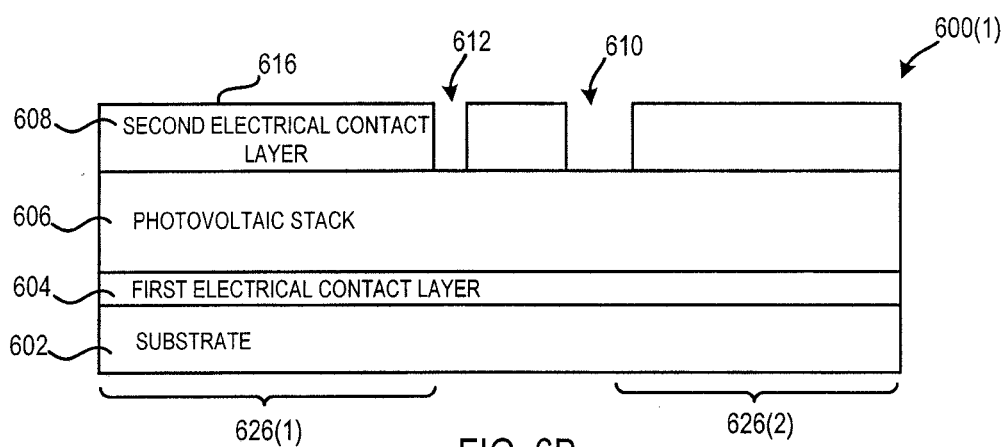

In step 302 of process 204(1), at least one cell isolation scribe 610 is formed in the stack of thin film layers. Additionally, in step 302, a second electrical contact layer isolation scribe 612 is also formed in the stack of thin film layers for each cell isolation scribe 610. FIG. 6B shows a stack 600(1), which is an example of stack 600 after an embodiment of step 302 is performed thereon. Cell isolation scribes 610 delineate the stack of thin film layers into a plurality of photovoltaic cells. The quantity and configuration of cell isolation scribes 610 determine the quantity of photovoltaic cells formed from the stack. For example, if a stack of thin film layers is delineated with two orthogonal cell isolation scribes 610, the stack will form four photovoltaic cells. Each cell isolation scribe in step 302 extends from a top surface 616 of the stack of thin film layers to photovoltaic stack 606.

Each of the second electrical contact layer isolation scribes 612 is adjacent to a respective cell isolation scribe 610. Each second electrical contact layer isolation scribe 612 also extends from top surface 616 to photovoltaic stack 606. Second electrical contact layer isolation scribes 612 delineate the ends of photovoltaic cells. For example, FIG. 6B shows stack 600(1) forming two photovoltaic cells 626(1) and 626(2). A second electrical contact layer isolation scribe 612 delineates the end of photovoltaic cell 626(1).

Figure 6C:
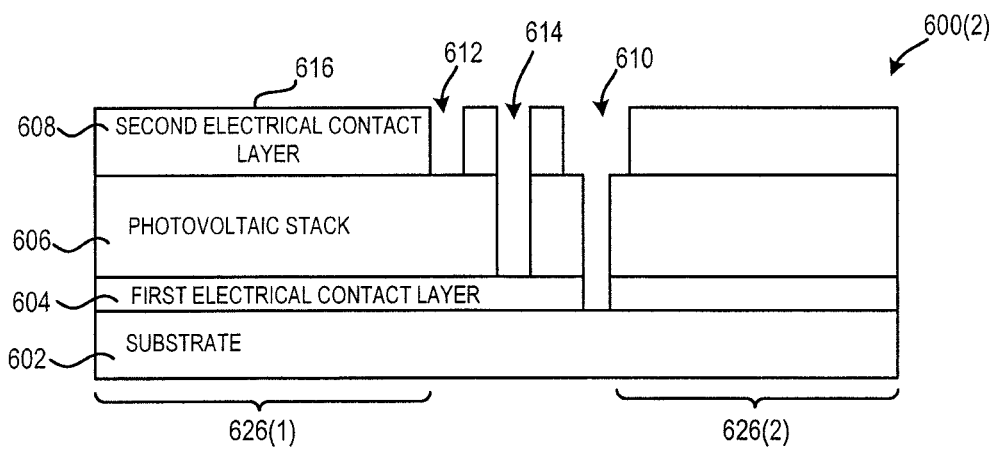

In step 304, a via scribe 614 is formed in the stack of thin film layers between each cell isolation scribe 610 and its corresponding second electrical contact layer isolation scribe 612. Furthermore, in step 304, each cell isolation scribe 610 is extended to substrate 602. FIG. 6C shows a stack 600(2), which is an example of stack 600(1) after an embodiment of step 304 is performed thereon.

Each via scribe 614 extends from top surface 616 of the stack of thin film layers to first electrical contact layer 604. In the example of FIG. 6C, via scribes 614 extend from top surface 616 through second electrical contact layer 608 and photovoltaic stack 606 to first electrical contact layer 604. In step 304, each cell isolation scribe 610 is extended such that it extends from top surface 616 down to insulating substrate 602.

In the example FIG. 6C, cell isolation scribe 610 delineates the beginning of photovoltaic cell 626(2). Electrical contributions (i.e., electrical power generation) from the area between photovoltaic cells (e.g., between photovoltaic cells 626(1) and 626(2) of) are lost as a result of patterning (i.e., forming cell isolation scribes 610 and second electrical contact layer isolating scribes 612). Such areas between adjacent photovoltaic cells (i.e., between each second electrical contact layer isolation scribe 612 and its corresponding cell isolation scribe 610) are used to electrically connect the adjacent photovoltaic cells, as discussed below.

Figure 6D:
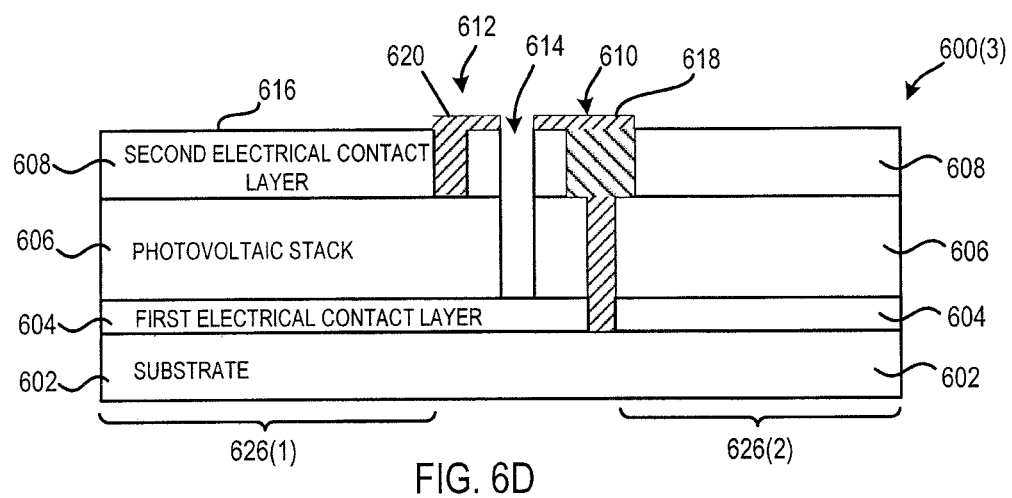

Step 304 proceeds to step 306 wherein an insulating ink 618 is disposed in each cell isolation scribe 610 using a printing process. FIG. 6D shows a stack 600(3), which is an example of stack 600(2) after an embodiment of step 306 is performed thereon. Insulating ink 618 provides electrical isolation between adjacent photovoltaic cells (e.g., between photovoltaic cells 626(1) and 626(2) of FIG. 6D). In a similar manner, an optional insulating ink 620 may further be disposed in step 306 (e.g., at the same time as disposing insulating ink 618) to fill second electrical contact layer isolation scribe 612. Both insulating inks 618 and 620 may be applied using an ink jet printing process.

Figure 6E:
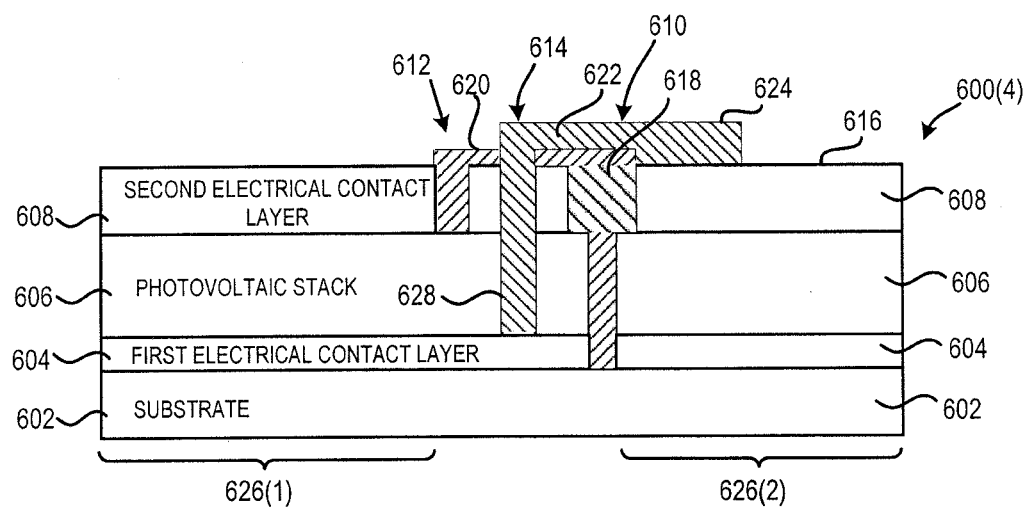

In step 308, conductive ink 622 is disposed in each via scribe 614 using a printing process to form a via 628. Conductive ink 622 may be further disposed on top surface 616 of the stack of thin film layers using the printing process to form a conductive grid 624 over a corresponding adjacent cell isolation scribe 610, as illustrated in FIG. 6E. Conductive grid 624 electrically connects adjacent photovoltaic cells. FIG. 6E shows a stack 600(4), which is an example of stack 600(3) after an embodiment of step 308 is performed thereon. It should be noted that top surface 616 of the stack of thin film layers may least partially include insulating ink (e.g., insulating ink 618, 620) that was applied during step 306.

In the example of FIG. 6E, via 628 electrically connects first electrical contact layer 604 of photovoltaic cell 626(1) to conductive grid 624. Conductive grid 624 in turn connects via 628 to second electrical contact layer 608 of photovoltaic cell 626(2). Accordingly, first electrical contact layer 604 of photovoltaic cell 626(1) is connected to second electrical contact layer 608 of photovoltaic cell 626(2) by via 628 and conductive grid 624.

Conductive ink 622 may be applied using an ink jet printing process. In process 204(1), cell isolation scribes 610, second electrical contact layer isolation scribes 612, and/or via scribes 614 may be formed using a laser scribing process. Such laser scribing processes may be executed using a production apparatus (e.g., laser system) with the means for translating either the substrate, a laser beam, or both, to achieve the desired pattern.

Figure 4:
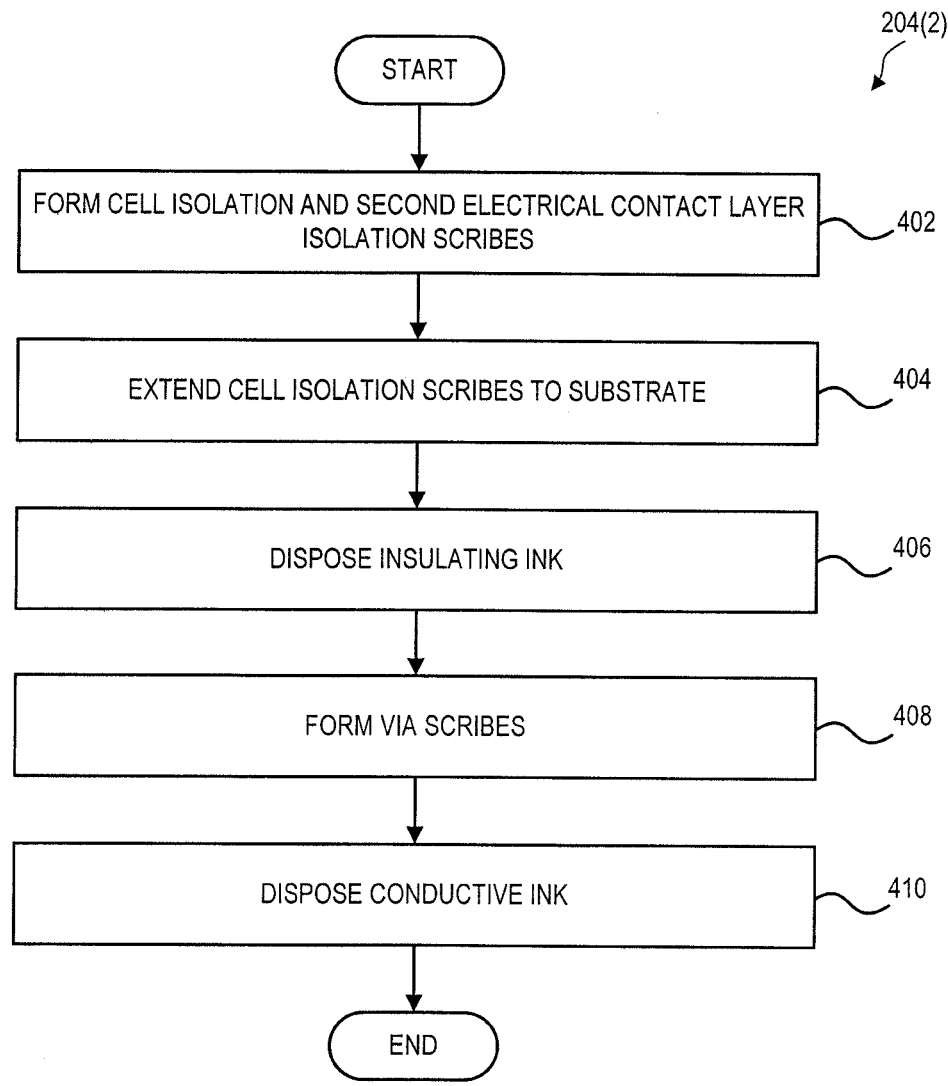
FIG. 4 shows one process of performing scribing and printing processes, in accord with an embodiment.

FIG. 4 shows another process 204(2) of performing scribing and printing processes to form an array of monolithically integrated thin film photovoltaic cells from a stack of thin film layers formed on an insulating substrate. Process 204(2) is an embodiment of process 204 of performing isolating and connecting processes. FIGS. 7A-7F are cross-sectional views of an array of monolithically integrated photovoltaic cells being formed according to process 204(2); FIGS. 7A-7F should be referred to in conjunction with FIG. 7.

Process 204(2) is executed on a stack of thin film layers formed on an insulating substrate. For example, process 204(2) may be executed on stack 700 of FIG. 7A. Stack 700, which is an embodiment of stack 500 of FIG. 5, or stack 600 of FIG. 6A, includes an insulating substrate 702 on which a first electrical contact layer 704 is formed. A photovoltaic stack 706 is formed on first electrical contact layer 704, and a second electrical contact layer 708 is formed on photovoltaic stack 706. Stack 700 may include layers in addition to those illustrated in FIG. 7A.

Figure 7A:
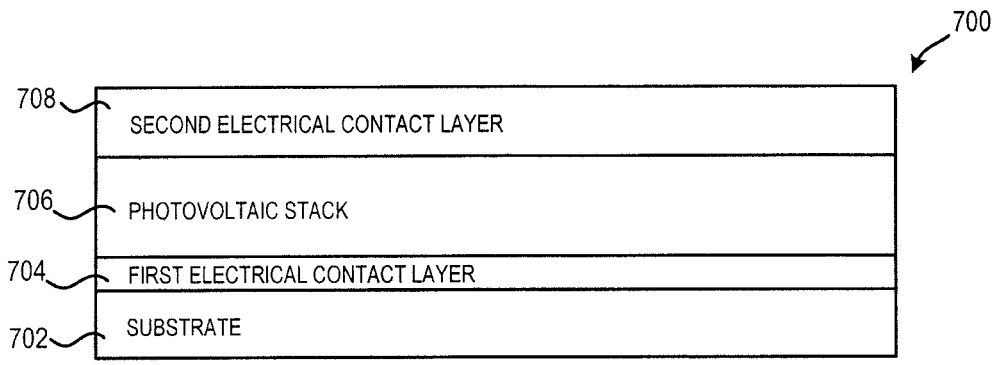
FIGS. 7A-7F are cross-sectional views of an array of monolithically integrated photovoltaic cells formed according to an embodiment of the process of FIG. 4.
Figure 7B:
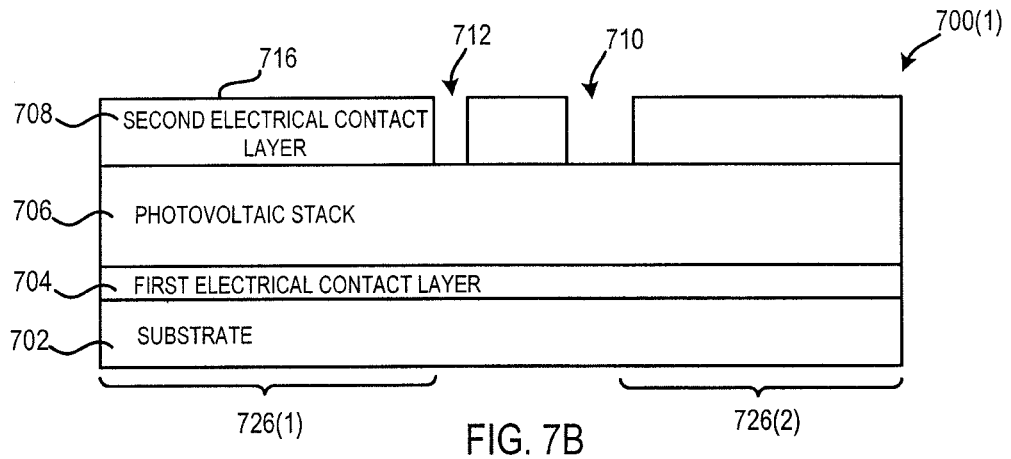

In step 402 of process 204(2), at least one cell isolation scribe 710 and a corresponding second electrical contact layer isolation scribe 712 are formed in the stack of thin film layers. FIG. 7B shows a stack 700(1), which is an example of stack 700 after an embodiment of step 402 is performed thereon. Cell isolation scribes 710 delineate the stack of thin film layers into a plurality of photovoltaic cells. The quantity and configuration of cell isolation scribes 710 determine the quantity of photovoltaic cells formed from the stack. For example, if a stack of thin film layers is delineated with two orthogonal cell isolation scribes 710, the stack will form four photovoltaic cells. Each cell isolation scribe 710 in step 402 extends from a top surface 716 of the stack of thin film layers to photovoltaic stack 706.

Each second electrical contact layer isolation scribe 712 is adjacent to its respective cell isolation scribe 710. Each second electrical contact layer isolation scribe 712 also extends from top surface 716 to photovoltaic stack 706. Second electrical contact layer isolation scribes 712 delineate the ends of photovoltaic cells. For example, FIG. 7B shows stack 700(1) forming two photovoltaic cells 726(1) and 726(2). A second electrical contact layer isolation scribe 712 delineates the end of photovoltaic cell 726(1).

Figure 7C:
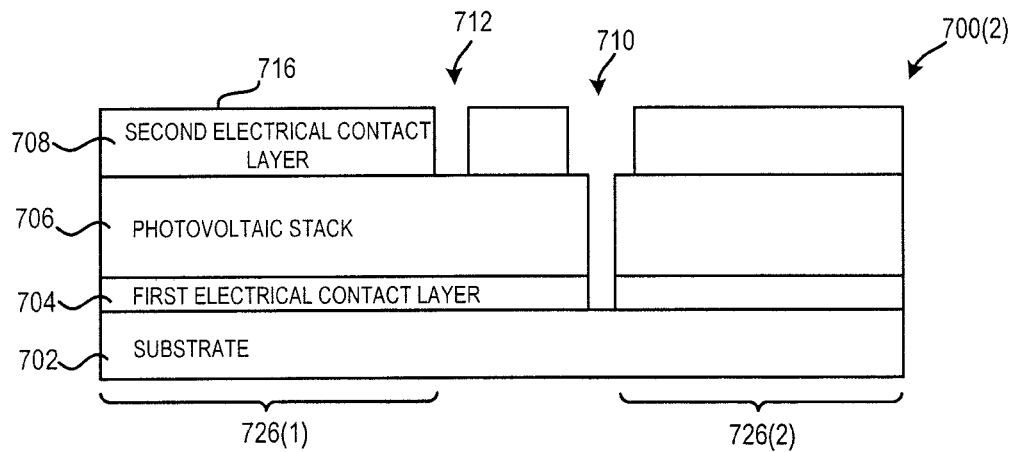

In step 404, each cell isolation scribe 710 is extended such that it extends from top surface 716 of the stack of thin film materials down to insulated substrate 702. FIG. 7C shows a stack 700(2), which is an example of stack 700(1) after an embodiment of step 404 is performed thereon. In the example of FIG. 7C, cell isolation scribe 710 delineates the beginning of photovoltaic cell 726(2).

Figure 7D:
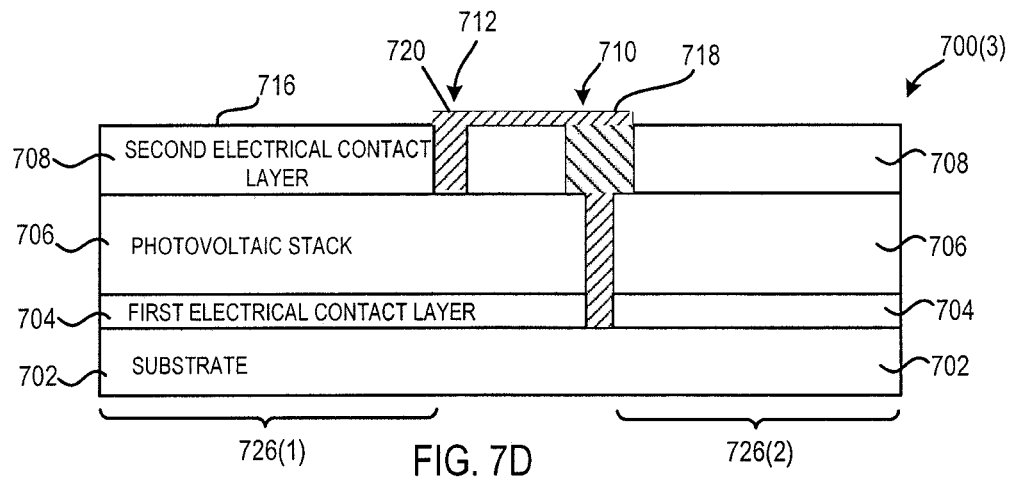

Step 404 proceeds to step 406, where an insulating ink 718 is disposed in each cell isolation scribe 710 using a printing process. FIG. 7D shows a stack 700(3), which is an example of stack 700(2) after an embodiment of step 406 is performed thereon. The insulating ink provides electrical isolation between adjacent photovoltaic cells. In a similar manner, an optional insulating ink 720 may be disposed during step 406 (e.g., at the same time as insulating ink is disposed in cell isolation scribes 710) to fill second electrical contact layer isolation scribes 712. Both inks 718 and 720 may be applied using an ink jet printing process, and may intersect in between cell isolation scribes 710 and second electrical contact layer isolation scribes 712.

Figure 7E:
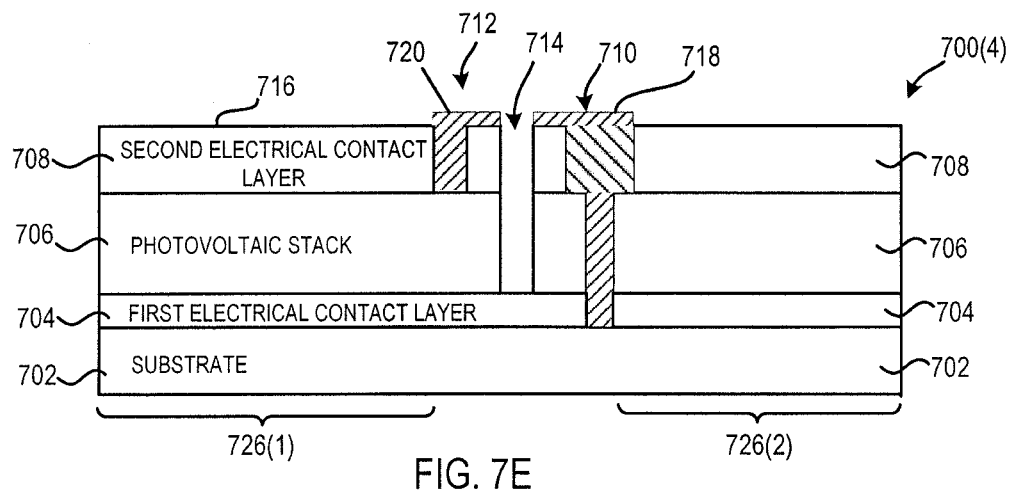

In step 408, a via scribe 714 is formed in the stack of thin film layers between each cell isolation scribe 710 and its respective second electrical contact layer isolation scribe 712. FIG. 7E shows a stack 700(4), which is an example of stack 700(3) after an embodiment of step 408 is performed thereon. Via scribe 714 extends from top surface 716 of the stack of thin film layers to first electrical contact layer 704. In the example of FIG. 7E, via scribe 714 extends from top surface 716 through second electrical contact layer 708 and photovoltaic stack 706 to first electrical contact layer 704.

Figure 7F:
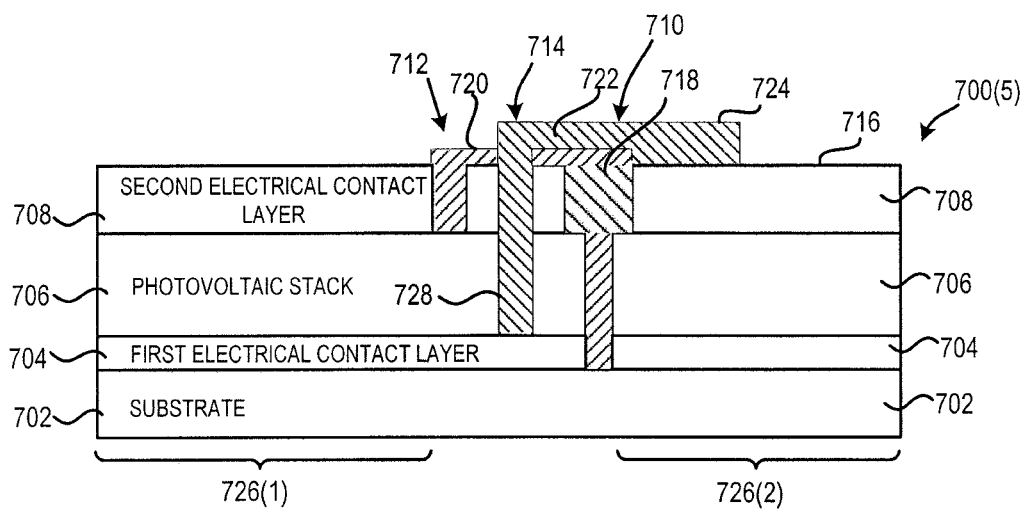

In step 410, conductive ink 722 is disposed in each via scribe 714 using a printing process to form a via 728. Conductive ink 722 is further disposed on top surface 716 of the stack of thin films using the printing process to form a conductive grid 724 over a corresponding adjacent cell isolation scribe 710. Conductive grid 724 electrically connects adjacent photovoltaic cells. FIG. 7F shows a stack 700(5), which is an example of stack 700(4) after an embodiment of step 410 is performed thereon. It should be noted that top surface 716 of the stack of thin film layers may least partially include insulating ink (e.g., insulating ink 718, 720) that was applied during step 406.

In the example of FIG. 7F, via 728 electrically connects first electrical contact layer 704 of photovoltaic cell 726(1) to conductive grid 724. Conductive grid 724 in turn connects via 728 to second electrical contact layer 708 of photovoltaic cell 726(2). Accordingly, first electrical contact layer 704 of photovoltaic cell 726(1) is connected to second electrical contact layer 708 of photovoltaic cell 726(2). Electrical contributions (i.e., generation of electric power) from the area between photovoltaic cells 726(1) and 726(2) (e.g., between each second electrical contact layer isolation scribe 712 and its respective cell isolation scribe 710) are lost as a result of patterning.

Conductive ink 722 may be applied using an ink jet printing process. In process 204(2), cell isolation scribes 710, second electrical contact layer isolation scribes 712, and/or via scribes 714 may be formed using a laser scribing process. Such a laser scribing process may be executed using a production apparatus (e.g., laser system) with the means for translating either the substrate, a laser beam, or both, to achieve the desired pattern.

Figure 8:
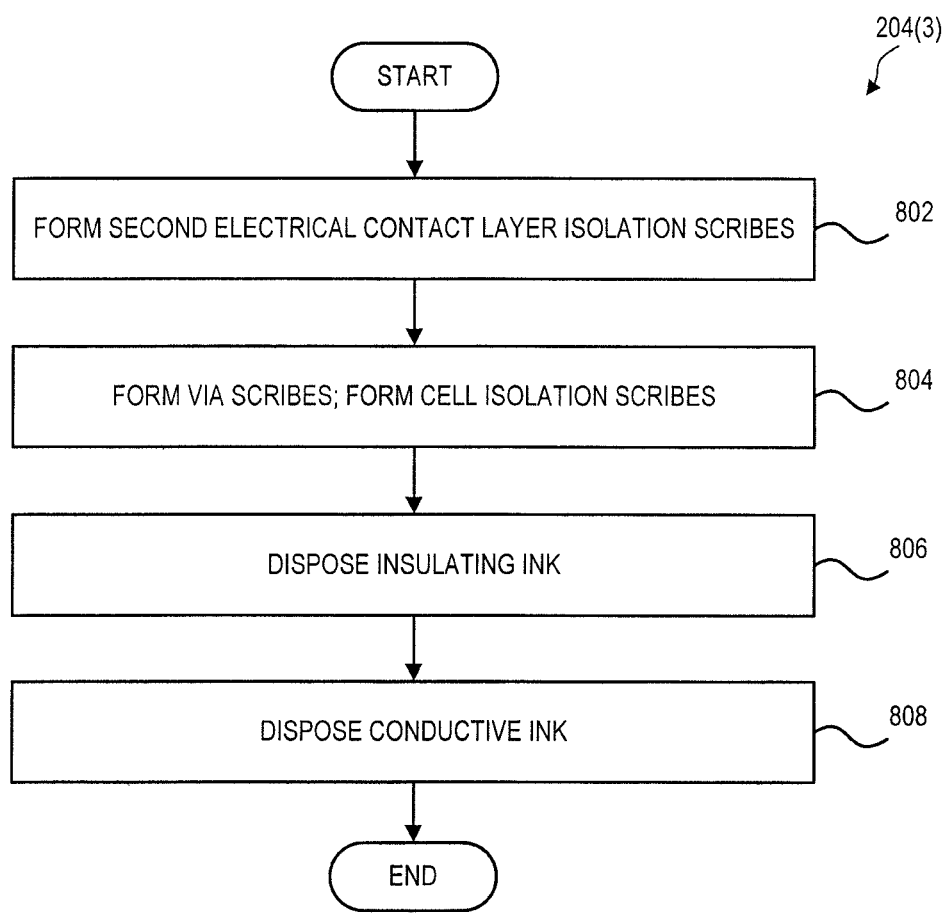
FIG. 8 shows one process of performing scribing and printing processes, in accord with an embodiment.

FIG. 8 shows one process 204(3) of performing scribing and printing processes to form an array of monolithically integrated thin film photovoltaic cells from a stack of thin film layers formed on an insulating substrate. Process 204(3) is an embodiment of step 204, and shows substeps of performing isolating and connecting processes. FIGS. 10A-10E are cross-sectional views of an array of monolithically integrated photovoltaic cells being formed according to process 204(3); FIGS. 10A-10E should be referred to in conjunction with FIG. 8.

Process 204(3) may be executed on a stack of thin film layers formed on an insulating substrate. For example, process 204(3) may be executed on stack 1000 of FIG. 10A. Stack 1000, which is an embodiment of stack 500 (see, FIG. 5), stack 600 (see, FIG. 6A), or stack 700 (see, FIG. 7A), has a first electrical contact layer 1004 formed on an insulating substrate 1002. A photovoltaic stack 1006 is formed on first electrical contact layer 1004, and a second electrical contact layer 1008 is formed on photovoltaic stack 1008. Stack 1000 may have layers in addition to those illustrated in FIGS. 10A-10E.

Figure 10A:
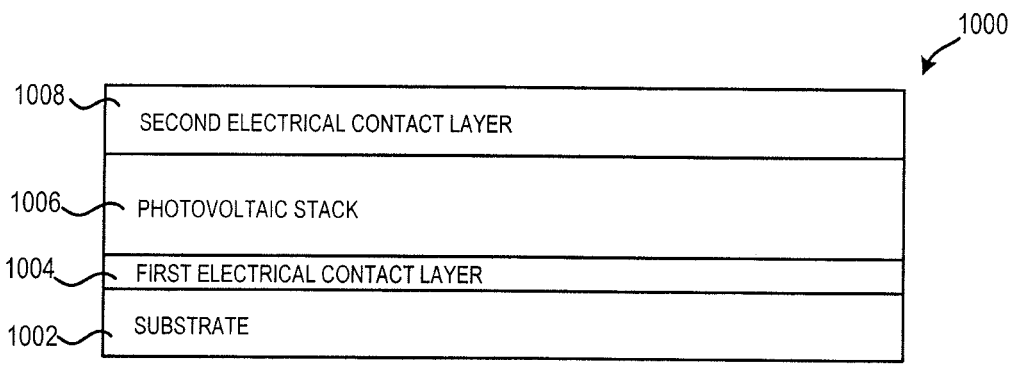
FIGS. 10A-10E are cross-sectional views of an array of monolithically integrated photovoltaic cells formed according to an embodiment of the process of FIG. 8.
Figure 10B:
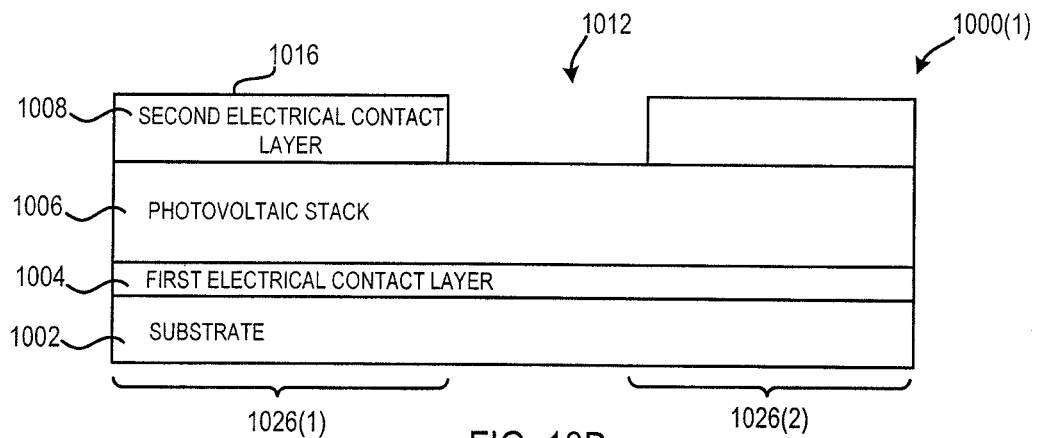

In step 802 of process 204(3), at least one second electrical contact layer isolation scribe 1012 is formed in the stack of thin film layers. FIG. 10B shows a stack 1000(1), which is an example of stack 1000 after an embodiment of step 802 is performed thereon. Each second electrical contact layer isolation scribe 1012 extends from a top surface 1016 to photovoltaic stack 1006. Second electrical contact layer isolation scribes 1012 delineate the ends of photovoltaic cells 1026. For example, FIG. 10B shows stack 1000(1) forming two photovoltaic cells 1026(1) and 1026(2). A second electrical contact layer isolation scribe 1012 delineates the end of photovoltaic cell 1026(1).

Figure 10C:
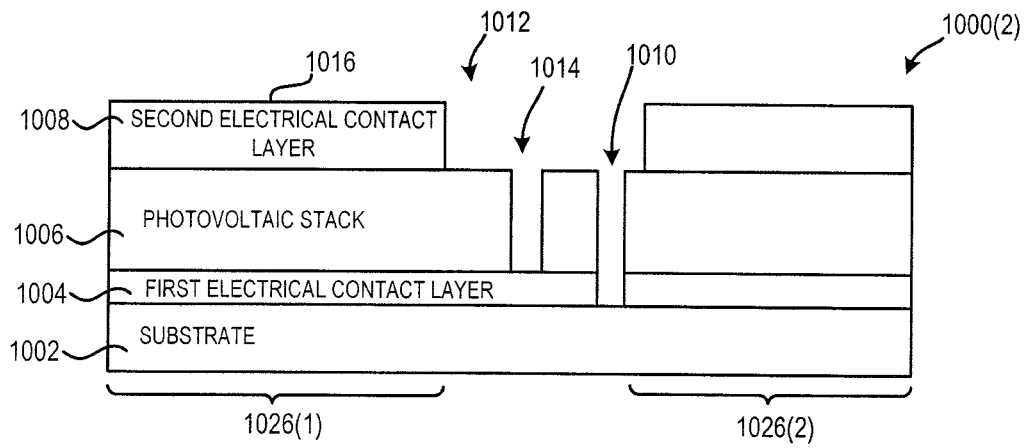

In step 804, a first portion of each second electrical contact layer isolation scribe 1012 is extended to substrate 1002 to form a cell isolation scribe 1010. Furthermore, in step 804, a second portion of each second electrical contact layer isolation scribe 1012 is extended to first electrical contact layer 1004 to form a via scribe 1014. The first portion may be in a different region of second electrical contact layer isolation scribe 1012 than the second portion. Accordingly, each cell isolation scribe 1010 and corresponding via scribe 1014 may extend from a common respective cell isolation scribe 1012, and each cell isolation scribe 1010 and corresponding via scribe 1014 may occupy a different portion of stack 1000's volume. FIG. 10C shows a stack 1000(2), which is an example of stack 1000(1) after an embodiment of step 804 is performed thereon.

Cell isolation scribes 1010 delineate the stack of thin film layers into a plurality of photovoltaic cells 1026. The quantity and configuration of cell isolation scribes 1010 determine the quantity of photovoltaic cells formed from the stack. For example, if a stack of thin film layers is delineated with two orthogonal cell isolation scribes 1010, the stack will form four photovoltaic cells.

In the example FIG. 10C, cell isolation scribe 1010 delineates the beginning of photovoltaic cell 1026(2). Electrical contributions (i.e., electrical power generation) from the area between photovoltaic cells (e.g., between photovoltaic cells 1026(1) and 1026(2)) are lost as a result of patterning. Such areas between adjacent photovoltaic cells can be used to electrically connect the adjacent photovoltaic cells, as discussed below.

Figure 10D:
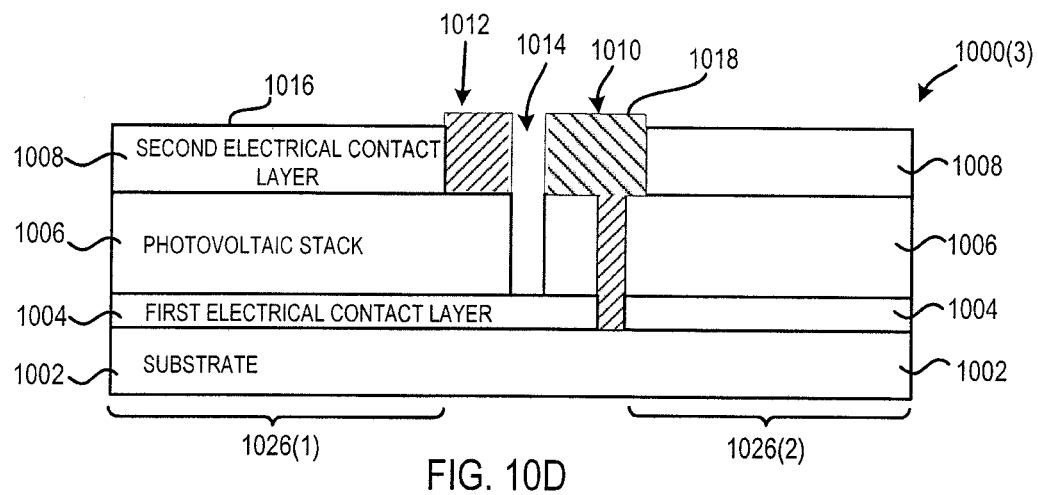

In step 806, insulating ink 1018 is disposed in each cell isolation scribe 1010 and in each second electrical contact layer isolating scribe 1012 using a printing process. FIG. 10D shows a stack 1000(3), which is an example of stack 1000(2) after an embodiment of step 806 is performed thereon. It should be noted that insulating ink does not necessarily fill via scribe 1014 in step 806. Insulating ink 1018 provides electrical isolation between adjacent photovoltaic cells (e.g., between photovoltaic cells 1026(1) and 1026(2) of FIG. 10D). Insulating ink 1018 may be applied using an ink jet printing process.

Figure 10E:
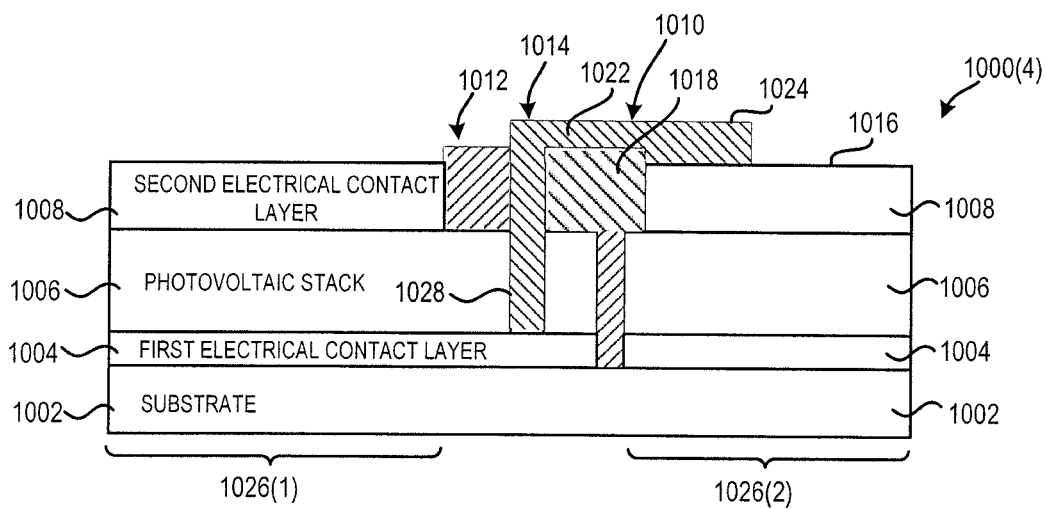

In step 808, conductive ink 1022 is disposed in each via scribe 1014 using a printing process to form a via 1028. Conductive ink 1022 may be further disposed on top surface 1016 of the stack of thin film layers 1000(4) using the printing process to form a conductive grid 1024 over a corresponding adjacent cell isolation scribe 1010, as illustrated in FIG. 10E. Conductive grid 1024 electrically connects adjacent photovoltaic cells 1026. FIG. 10E shows a stack 1000(4), which is an example of stack 1000(3) after an embodiment of step 808 is performed thereon. It should be noted that top surface 1016 of the stack of thin film layers 1000(4) may least partially include insulating ink (e.g., insulating ink 1018) that was applied during step 806.

In the example of FIG. 10E, via 1028 electrically connects first electrical contact layer 1004 of photovoltaic cell 1026 (1) to conductive grid 1024. Conductive grid 1024 in turn connects via 1028 to second electrical contact layer 1008 of photovoltaic cell 1026(2). Accordingly, first electrical contact layer 1004 of photovoltaic cell 1026(1) is connected to second electrical contact layer 1008 of photovoltaic cell 1026(2) by via 1028 and conductive grid 1024.

Conductive ink 1022 may be applied using an ink jet printing process. In process 204(3), cell isolation scribes 1010, second electrical contact layer isolation scribes 1012, and/or via scribes 1014 may be formed using a laser scribing process. Such laser scribing processes may be executed using a production apparatus (e.g., laser system) with the means for translating either the substrate, a laser beam, or both, to achieve the desired pattern.

Figure 9:
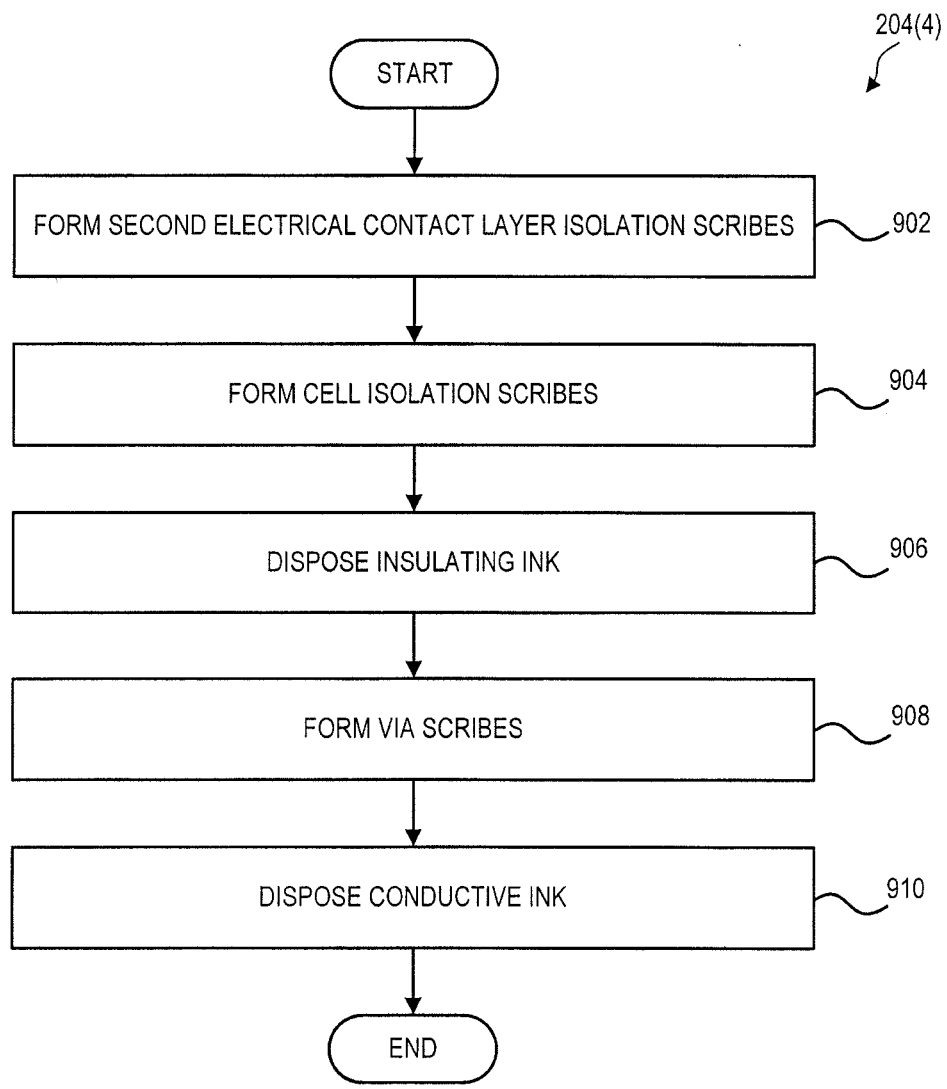
FIG. 9 shows one process of performing scribing and printing processes, in accord with an embodiment.

FIG. 9 shows another process 204(4) of performing scribing and printing processes to form an array of monolithically integrated thin film photovoltaic cells from a stack of thin film layers formed on an insulating substrate. Process 204(4) is an embodiment of process 204 of performing isolating and connecting processes. FIGS. 11A-11F are cross-sectional views of an array of monolithically integrated photovoltaic cells being formed according to process 204(4); FIGS. 11A-11F should be referred to in conjunction with FIG. 9.

Process 204(4) is executed on a stack of thin film layers formed on an insulating substrate. For example, process 204(4) may be executed on stack 1100 of FIG. 11A. Stack 1100, which is an embodiment of stack 500 of FIG. 5, stack 600 of FIG. 6A, or stack 1000 of FIG. 10A, includes an insulating substrate 1102 on which a first electrical contact layer 1104 is formed. A photovoltaic stack 1106 is formed on first electrical contact layer 1104, and a second electrical contact layer 1108 is formed on photovoltaic stack 1106. Stack 1100 may include layers in addition to those illustrated in FIG. 11A.

Figure 11A:
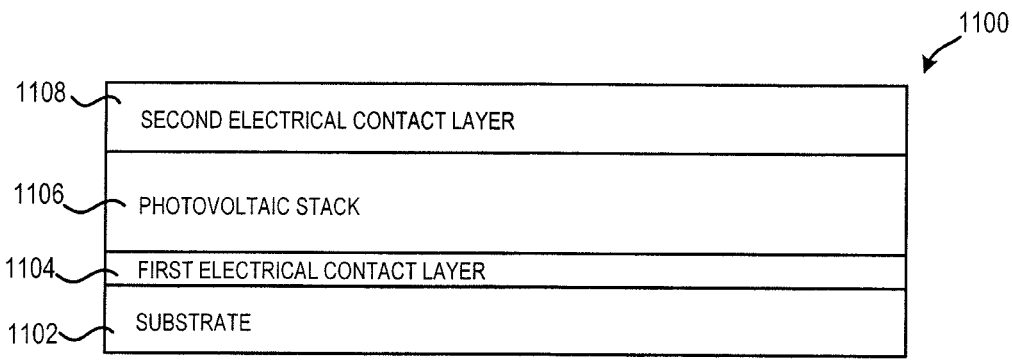
FIGS. 11A-11F are cross-sectional views of an array of monolithically integrated photovoltaic cells formed according to an embodiment of the process of FIG. 9.
Figure 11B:
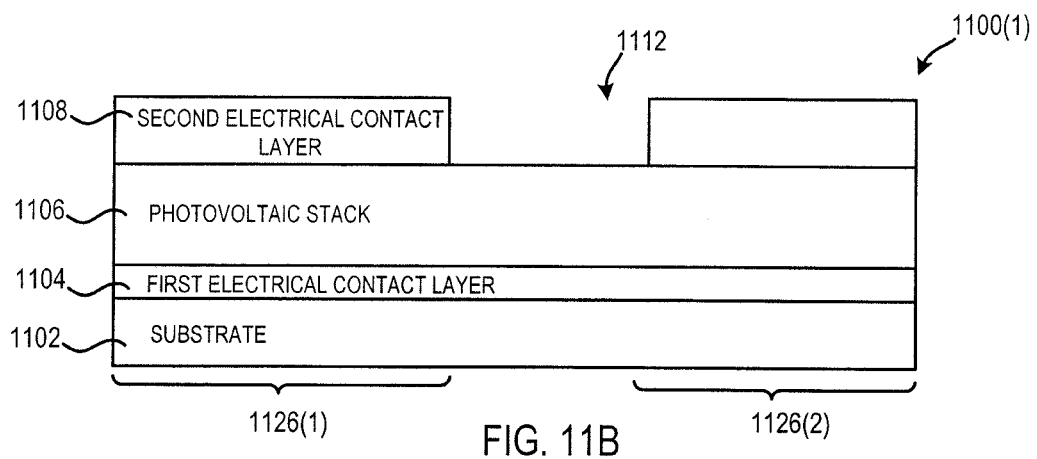

In step 902 of process 204(4), at least one second electrical contact layer isolation scribe 1112 is formed in the stack of thin film layers 1100. FIG. 11B shows a stack 1100(1), which is an example of stack 1100 after an embodiment of step 902 is performed thereon. Second electrical contact layer isolation scribes 1112 delineate the ends of photovoltaic cells 1126. For example, FIG. 11B shows stack 1100(2) forming two photovoltaic cells 1126(1) and 1126(2). A second electrical contact layer isolation scribe 1112 delineates the end of photovoltaic cell 1126(1).

Figure 11C:
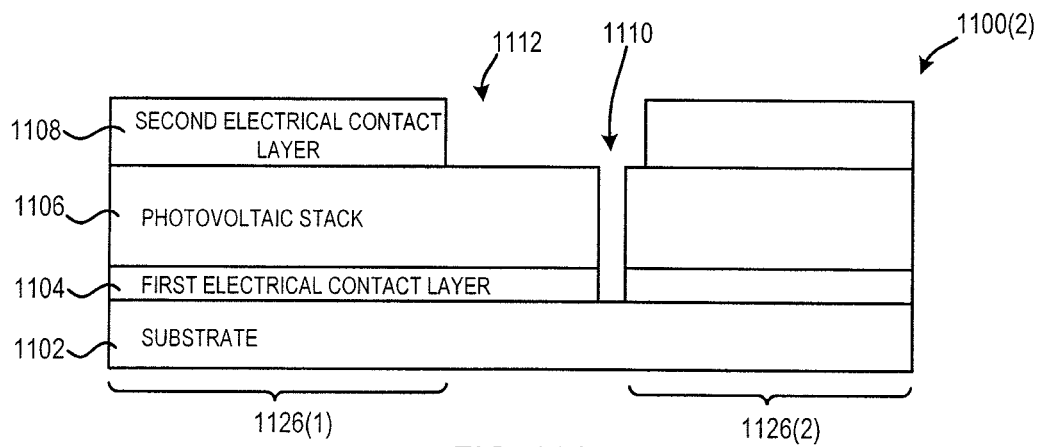

In step 904, a first portion of each second electrical contact layer isolation scribe 1112 is extended down to substrate 1102 to form a cell isolation scribe 1110. FIG. 11C shows a stack 1100(2), which is an example of stack 1100(1) after an embodiment of step 904 is performed thereon. Cell isolation scribes 1110 delineate the stack of thin film layers into a plurality of photovoltaic cells 1126. The quantity and configuration of cell isolation scribes 1110 determine the quantity of photovoltaic cells 1126 formed from the stack. For example, if a stack of thin film layers 1100 is delineated with two orthogonal cell isolation scribes 1110, the stack 1100(2) will form four photovoltaic cells 1126. In the example of FIG. 11C, cell isolation scribe 1110 delineates the beginning of photovoltaic cell 1126(2).

Figure 11D:
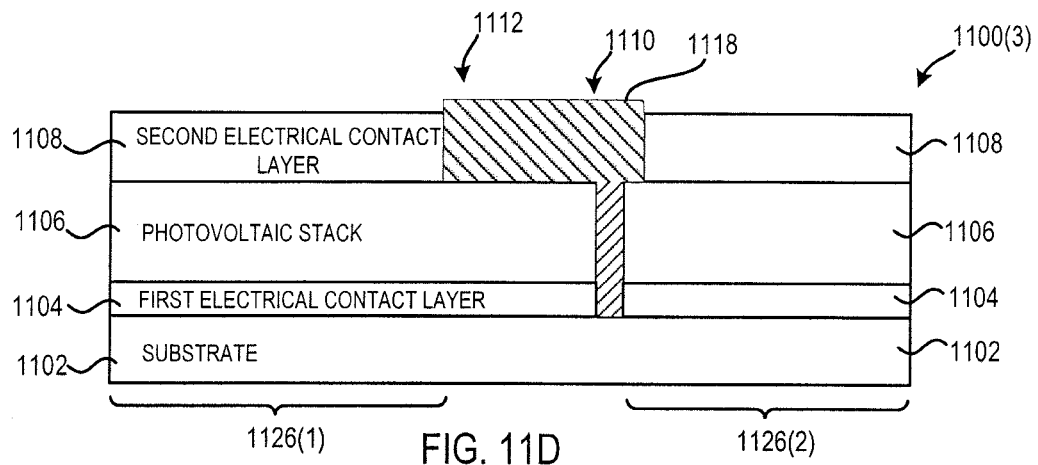

In step 906, an insulating ink 1118 is disposed in each cell isolation scribe 1110 and in each second electrical contact layer isolation scribe 1112 using a printing process. FIG. 11D shows a stack 1100(3), which is an example of stack 1100(2) after an embodiment of step 906 is performed thereon. The insulating ink provides electrical isolation between adjacent photovoltaic cells. Ink 1118 may be applied using an ink jet printing process.

Figure 11E:
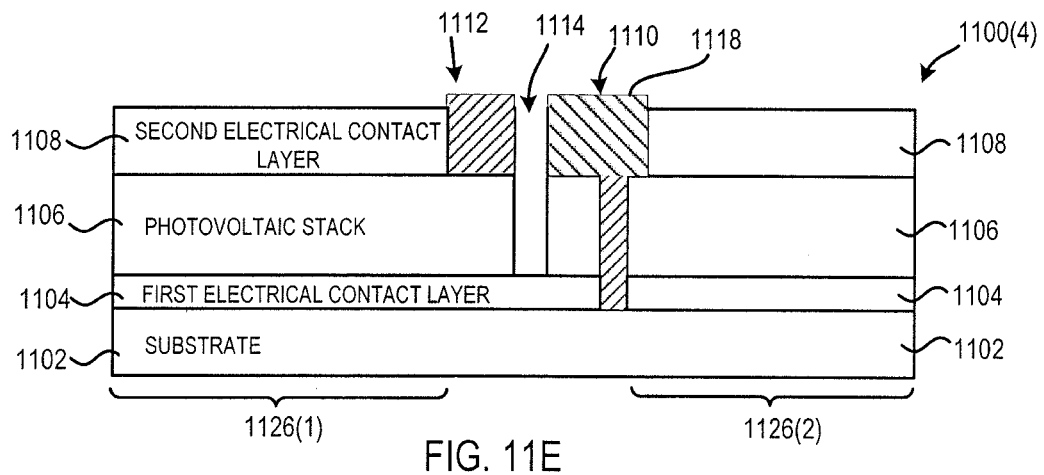

In step 1108, a via scribe 1114 is formed in the stack of thin film layers adjacent to each cell isolation scribe 1110. FIG. 11E shows a stack 1100(4), which is an example of stack 1100(3) after an embodiment of step 908 is performed thereon. Via scribe 1114 extends through the insulating ink of a second portion of the second electrical contact layer isolation scribe 1112 to first electrical contact layer 1104. The second portion may be in a different region of second electrical contact layer isolation scribe 1112 than the first portion. Accordingly, each via scribe 1114 and cell isolation scribe 1110 may occupy a different portion of stack 1100's volume.

Figure 11F:
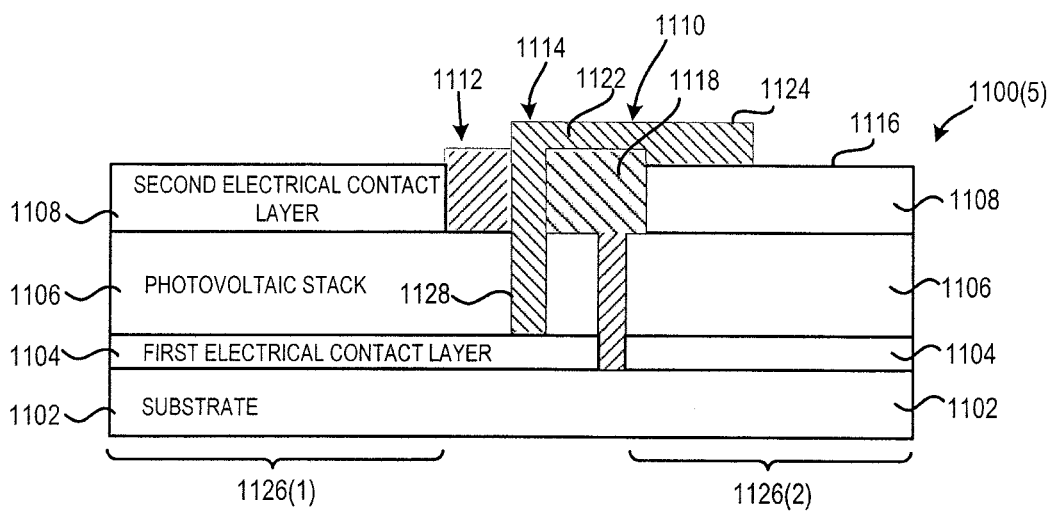

In step 910, conductive ink 1122 is disposed in each via scribe 1114 using a printing process to form a via 1128. Conductive ink 1122 is further disposed on top surface 1116 of the stack of thin films 1100(5) using the printing process to form a conductive grid 1124 over a corresponding adjacent cell isolation scribe 1110. Conductive grid 1124 electrically connects adjacent photovoltaic cells 1126. FIG. 11F shows a stack 1100(5), which is an example of stack 1100(4) after an embodiment of step 910 is performed thereon. It should be noted that top surface 1116 of the stack of thin film layers 1100(5) may least partially include insulating ink (e.g., insulating ink 1118) that was applied during step 906.

In the example of FIG. 11F, via 1128 electrically connects first electrical contact layer 1104 of photovoltaic cell 1126 (1) to conductive grid 1124. Conductive grid 1124 in turn connects via 1128 to second electrical contact layer 1108 of photovoltaic cell 1126(2). Accordingly, first electrical contact layer 1104 of photovoltaic cell 1126(1) is connected to second electrical contact layer 1108 of photovoltaic cell 1126(2). Electrical contributions (i.e., generation of electric power) from the area between photovoltaic cells 1126(1) and 1126(2) are lost as a result of patterning.

Conductive ink 1122 may be applied using an ink jet printing process. In process 204(4), cell isolation scribes 1110, second electrical contact layer isolation scribes 1112, and/or via scribes 1114 may be formed using a laser scribing process. Such a laser scribing processes may be executed using a production apparatus (e.g., laser system) with the means for translating either the substrate, a laser beam, or both, to achieve the desired pattern.

In other embodiments of processes 204(1), 204(2), 204 (3), and 204(4), the order of steps may be varied. For example, second electrical contact layer isolation scribes 612 and 712 need not be formed in step 302 and 402 respectively; second electrical contact layer isolation scribes 612 and 712 may be formed after step 308 and 410, respectively, for example. As another example, cell isolation scribes 610 and 710 may be cut to their final depth (to substrates 602 and 702, respectively) in steps 302 and 402, respectively, thereby eliminating the need to extend cell isolation scribes 610 and 710 in steps 304 and 404, respectively. Additionally, it should be understood that processes described in FIGS. 3, 4, 8, and 9 represent only some of the possible embodiments of step 204 of FIG. 2.

FIG. 12 is a top plan view of array 1200 of monolithically integrated photovoltaic cells 1202, and FIG. 13 is a cross-sectional view of array 1200, as seen from side 1204 of array 1200. Array 1200 is formed according to an embodiment of process 204(1) or 204(2) of FIG. 3 and FIG. 4, respectively. Array 1200 is illustrated as having four photovoltaic cells 1202(1)-1202(4), which are shown as rectangular columns in FIG. 12. However, array 1200 may have any quantity of photovoltaic cells 1202. Photovoltaic cells 1202(1)-1202(4) are electrically connected in series between electrical terminals 1230 and 1232. Terminal 1230 is electrically connected to the back contact layer 1212 of photovoltaic cell 1202(1) by via 1220(5). Terminal 1232 is electrically connected to the top contact layer 1206 of photovoltaic cell 1202(4) by conductive grid 1222(4).

FIG. 13 shows array 1200 formed of thin film layers, including back contact layer 1212, solar absorber layer 1210, window layer 1208, and top contact layer 1206. An insulating substrate is disposed below a bottom surface 1234 of back contact layer 1212. However, a substrate is not shown in FIG. 13 for illustrative clarity. Array 1200 may include additional thin film layers besides those illustrated in FIG. 12. For example, array 1200 may include a buffer layer disposed between window layer 1208 and top contact layer 1206.

Photovoltaic cells 1202 of array 1200 are delineated by cell isolation scribes 1214, as can be seen in FIGS. 12 and 13. Cell isolation scribes 1214 may extend completely through the stack of thin film layers, as shown in FIG. 13. Each photovoltaic cell 1202 includes a second electrical contact layer isolation scribe 1216 disposed adjacent to each cell isolation scribe 1214. Each second electrical contact layer isolation scribe 1216 extends through a top contact layer 1206 of its respective photovoltaic cell 1202. Array 1200 is partially bounded by isolation scribes 1218, which also extend through second electrical contact layers 1206. Vias 1220, which are scribes filled with a conductive ink, each extend from the back contact layer of respective photovoltaic cells to a respective conductive grid 1222 formed on a top surface 1224 of top contact layers 1206. Each conductive grid 1222 includes a plurality of conducting elements 1236 electrically connected in parallel. Each conducting element 1236 of a conductive grid 1222 is electrically connected to the via 1220 electrically connected to the conductive grid. Each conductive grid 1222 and via 1220 provide electrical connection between adjacent PV cells 1202. In an embodiment, a separation distance 1226 can range from 300 to 700 µm, and a separation distance 1228 can range from 4 mm to 10 mm.

As discussed above with respect to FIG. 2, the step of forming the stack of thin film layers and the step performing the isolating and connecting processes may be separate respective steps 202 and 204 in process 200. This separation of steps may permit the use of one or more of the following processes, which may be advantageous in certain applications. First, a roll-to-roll deposition process may be used in a single deposition line for forming the stack of thin film layers on the insulating substrate. Second, a stack of thin film layers formed on an insulating substrate may be cut into requisite module sizes using a laser system capable of moving either the substrate or laser beam, or both, before performing the isolating and connecting processes. Third, the steps of forming scribes during the isolating process may be performed using a laser system capable of moving either the substrate or laser beam, or both. Fourth, scribing and printing processes of the isolating and connecting step may be performed with a single registration of the stack of thin film layers formed on an insulating substrate with a production apparatus. Fifth, the isolating and connecting processes may be performed using one integrated system. Sixth, the insulating ink may be protected from high vacuum and/or high temperatures required when forming the stack of thin film layers on an insulating substrate. Seventh, control methods employed when producing an array of monolithically integrated photovoltaic cells may be simplified. In particular, inspection and process control may be separated into two stages: one stage for forming the stack of thin film layers; and another stage for performing the isolating and connecting processes.

Changes may be made in the above methods and systems without departing from the scope hereof. It should thus be noted that the matter contained in the above description and shown in the accompanying drawings should be interpreted as illustrative, and not in a limiting sense. The following claims are intended to cover generic and specific features described herein, as well as all statements of the scope of the present method and system, which, as a matter of language, might be said to fall therebetween.

What is claimed is:

1. A process of forming an array of monolithically integrated thin film photovoltaic cells from a stack of thin film layers formed on an insulating substrate, the stack of thin film layers including a first electrical contact layer formed on the substrate, a photovoltaic stack formed on the first electrical contact layer, and a second electrical contact layer formed on the photovoltaic stack, the process comprising:
   forming at least one second electrical contact layer isolation scribe in the stack of thin film layers, each instance of the at least one second electrical contact layer isolation scribe extending at least through the second electrical contact layer of the stack of thin film layers;
   extending a first portion of the second electrical contact layer isolation scribe to the substrate to form a cell isolation scribe for each instance of the at least one second electrical contact layer isolation scribe;
   extending a second portion of the at least one second electrical contact layer isolation scribe to the first electrical contact layer to form a via scribe for each instance thereof, the first portion being in a different region of the second electrical contact layer isolation scribe than the second portion;
   disposing insulating ink in each cell isolation scribe and in each instance of the at least one second electrical contact layer isolation scribe such that insulating ink does not substantially fill the via scribe corresponding to the second electrical contact layer isolation scribe;
   each instance of the at least one second electrical contact layer isolation scribe having a first width, each cell isolation scribe having a second width, the first width being greater than the second width;
   disposing conductive ink in each via scribe to form a via; and
   disposing conductive ink along a top surface of the stack of thin film layers to form at least one conductive grid, each instance of the at least one conductive grid connecting a respective via to the second electrical contact layer of an adjacent photovoltaic cell.

2. The process of claim 1, the photovoltaic stack forming one or more photovoltaic junctions for converting electromagnetic energy into electric power.

3. The process of claim 2, the photovoltaic stack including a solar absorber layer and a window layer.

4. The process of claim 1, the step of disposing insulating ink being executed using an ink jet printing process.

5. The process of claim 1, the steps of disposing conductive ink being executed using an ink jet printing process.

6. The process of claim 1, at least one of the steps of extending and the step of forming being executed using a laser scribing process.

7. The process of claim 6, the laser scribing process including moving the stack of thin film layers formed on the insulating substrate on a production apparatus.

8. The process of claim 6, the laser scribing process including moving a laser beam on a production apparatus.

9. The process of claim 1, the insulating substrate selected from the group consisting of an insulated metal substrate, a glass substrate, and a polymeric material substrate.

10. The process of claim 1, each of the steps being executed with a single registration of the stack of thin film layers formed on the insulating substrate to a production apparatus.

11. The process of claim 1, each of the steps bang executed by a single production apparatus.

* * * * *